United States Patent
Ata et al.

(10) Patent No.: US 11,365,962 B2
(45) Date of Patent: Jun. 21, 2022

(54) FILTERING DEVICE, SENSOR DEVICE, FILTERING METHOD AND PROGRAM

(71) Applicant: Mitsubishi Electric Corporation, Tokyo (JP)

(72) Inventors: Daiki Ata, Tokyo (JP); Kazuhiko Nakamura, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/252,281

(22) PCT Filed: Jul. 6, 2018

(86) PCT No.: PCT/JP2018/025718
§ 371 (c)(1),
(2) Date: Dec. 15, 2020

(87) PCT Pub. No.: WO2020/008627
PCT Pub. Date: Jan. 9, 2020

(65) Prior Publication Data
US 2021/0148693 A1 May 20, 2021

(51) Int. Cl.
*G01B 11/02* (2006.01)
*G01B 21/04* (2006.01)

(52) U.S. Cl.
CPC .......... *G01B 11/026* (2013.01); *G01B 21/045* (2013.01)

(58) Field of Classification Search
CPC ..................... G01B 11/026; G01B 21/045
See application file for complete search history.

(56) References Cited

U.S. PATENT DOCUMENTS

| | | | |
|---|---|---|---|
| 3,851,398 A * | 12/1974 | Hilburger | B07C 5/08 33/501.09 |
| 6,463,115 B1 * | 10/2002 | Horiuchi | A61B 6/032 378/4 |
| 7,711,044 B1 * | 5/2010 | Hoang | H04N 19/117 375/240 |
| 2006/0020651 A1 | 1/2006 | Renger et al. | |
| 2012/0024273 A1 | 2/2012 | Iwazaki et al. | |

(Continued)

FOREIGN PATENT DOCUMENTS

| JP | 2006-10361 A | 1/2006 |
|---|---|---|
| JP | 2007-142893 A | 6/2007 |

(Continued)

OTHER PUBLICATIONS

NPL_281_1 Search Results, Jun. 26, 2021, 1 pp. (year: 2021).*

(Continued)

*Primary Examiner* — Toan M Le
*Assistant Examiner* — Xiuqin Sun
(74) *Attorney, Agent, or Firm* — Xsensus LLP

(57) ABSTRACT

A filtering device (20) includes an acquirer (21) and a filtering unit (22). The acquirer (21) acquires an input value that is repeatedly input. The filtering unit (22) obtains an output value by filtering for reduction of noise included in the input value. When a difference between the current input value and the past output value exceeds a first threshold, the filtering unit (22) obtains a new output value by weighting the current input value with a weight greater than a weight for obtaining the past output value.

10 Claims, 15 Drawing Sheets

(56) References Cited

U.S. PATENT DOCUMENTS

| | | | |
|---|---|---|---|
| 2012/0176343 A1 | 7/2012 | Holmgren et al. | |
| 2012/0303317 A1 | 11/2012 | Takimasa et al. | |
| 2016/0173863 A1 | 6/2016 | Kang et al. | |
| 2017/0163894 A1* | 6/2017 | Wakamatsu | H04N 5/23254 |
| 2017/0322019 A1* | 11/2017 | Takushima | G01S 17/08 |
| 2018/0061015 A1* | 3/2018 | Guo | G06T 5/002 |

FOREIGN PATENT DOCUMENTS

| | | |
|---|---|---|
| JP | 2012-18199 A | 1/2012 |
| JP | 2012-31776 A | 2/2012 |
| JP | 2012-32305 A | 2/2012 |
| JP | 2013-88290 A | 5/2013 |
| JP | 2015-503157 A | 1/2015 |
| JP | 2016-116221 A | 6/2016 |
| JP | 2016-183882 A | 10/2016 |
| JP | 2017-44626 A | 3/2017 |
| WO | 2018/103932 A1 | 6/2018 |

OTHER PUBLICATIONS

NPL_281_2 Search Results, Jun. 26, 2021, 1 pp. (year: 2021).*
International Search Report and Written Opinion dated Oct. 2, 2018, received for PCT Application No. PCT/JP2018/025718, filed on Jul. 6, 2018, 8 pages including English Translation.
Decision to Grant a Patent received for Japanese Patent Application No. 2019-511514, dated Apr. 2, 2019, 5 pages including English Translation.
Chinese Office Action dated Jun. 15, 2021, issued for the corresponding CN patent application No. 201880095293.2.
Office Action dated Jan. 4, 2022, in corresponding Chinese patent Application No. 201880095293.2, 14 pages.
Office Action dated Apr. 13, 2022 in Chinese Patent Application No. 201880095293.2, 16 pages.

* cited by examiner

FILTERING DEVICE, SENSOR DEVICE, FILTERING METHOD AND PROGRAM

CROSS-REFERENCE TO RELATED APPLICATION

The present application is based on PCT filing PCT/JP2018/025718, filed Jul. 6, 2018, the entire contents of which are incorporated herein by reference.

TECHNICAL FIELD

The present disclosure relates to a filtering device, a sensor device, a filtering method, and a program.

BACKGROUND ART

Various kinds of systems, including a production system, a processing system, and an inspection system using sensor-based measurements, operate in facilities such as factories. Since the sensor-based measurements normally include noise, filtering of the measurements is commonly conducted to reduce the noise. As filters for noise reduction, a moving average filter that averages measurements and an infinite impulse response (IIR) filter are known. Here, averaging the measurements includes various types of computations such as simple arithmetic mean as well as weighted average calculations.

For example, the moving average of n measurements is expected to reduce noise by a factor of approximately $1/\sqrt{n}$. Thus an increase in the count n of data that is subjected to the moving average can increase the noise reduction factor. As the data count n increases, however, when the measurements include a change that is different from noise, the value of the moving average would follow the change with increasing delay. A technique of setting the data count for use in the moving average in accordance with accuracy and response time set by a user has been proposed (see, for example, Patent Literature 1).

CITATION LIST

Patent Literature

Patent Literature 1: Unexamined Japanese Patent Application Publication

SUMMARY OF INVENTION

Technical Problem

In the technique of Patent Literature 1, once the data count is set, the moving average is calculated without modifying the setting relative to measurement data that is repeatedly input. Thus user settings emphasizing accuracy increase delay, while user settings emphasizing response time reduce accuracy. Thus there has been room for improvement on responsiveness while ensuring filtering performance for noise reduction to some extent.

In view of the above circumstances, an objective of the present disclosure is to improve responsiveness while ensuring filtering performance for noise reduction to some extent.

Solution to Problem

To achieve the above objective, a filtering device according to the present disclosure includes acquisition means for acquiring an input value that is repeatedly input and filtering means for obtaining an output value by filtering for reduction of noise included in the input value. When a difference between a current input value acquired by the acquisition means and a past output value obtained by the filtering means exceeds a first threshold, the filtering means obtains a new output value by weighting the current input value with a weight greater than a weight for obtaining the past output value.

Advantageous Effects of Invention

According to the present disclosure, when a difference between a current input value and a past output value exceeds a first threshold, the filtering means obtains a new output value by weighting the current input value with a weight greater than a weight for obtaining the past output value. The greater weight of the current input value decreases the contribution of the past data, thereby reducing delay. This can improve responsiveness while ensuring filtering performance for noise reduction to some extent.

DESCRIPTION OF EMBODIMENTS

A sensor device 10 that executes filtering according to an embodiment of the present disclosure is hereinafter described in detail with reference to the drawings.

Embodiment 1

Figure 1:
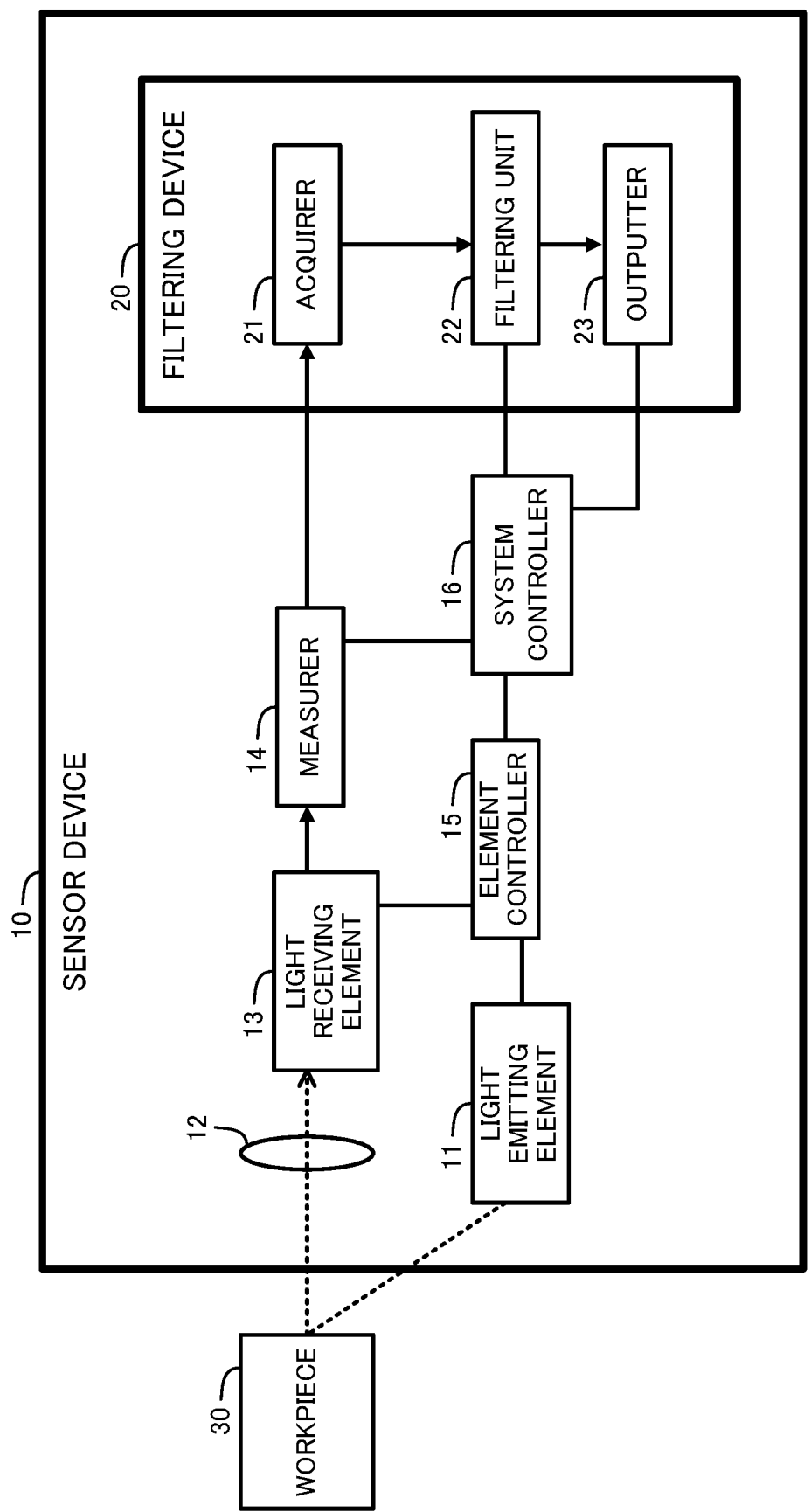
FIG. 1 is a block diagram illustrating a configuration of a sensor device according to Embodiment 1 of the present disclosure.

A sensor device 10 according to the present embodiment is a laser displacement sensor that uses laser light to measure an amount of change in distance to a target. As illustrated in FIG. 1, the sensor device 10 includes a light emitting element 11 that emits laser light toward a workpiece 30, a lens 12 for focusing reflection light reflected on the workpiece 30, a light receiving element 13 that receives the reflection light transmitted through the lens 12, a measurer 14 that calculates, from an output of the light receiving element 13, an amount of displacement of the workpiece 30 as a measurement value, an element controller 15 that controls the light emitting element 11 and the light receiving element 13, a system controller 16 that controls a laser displacement sensor system including the measurer 14, the element controller 15 and the filtering device 20, and a filtering device 20 that reduces noise included in the measurement value output by the measurer 14.

The light emitting element 11 includes a laser diode as a laser element. The light receiving element 13 is an imaging element that includes an array of photoelectric conversion elements. The photoelectric conversion elements each output a voltage value corresponding to received light intensity. The light receiving element 13 outputs to the measurer 14 information indicating distribution of the received light intensity.

The measurer 14 detects a peak from the distribution of the received light intensity and uses triangulation to calculate an amount of displacement from a light reception position of the peak to the workpiece 30. The measurer 14 outputs the calculated amount of displacement as a measurement value to the filtering device 20. The measurer 14 serves as measurement means in the claims.

The element controller 15 controls light emission of the light emitting element 11 and light reception of the light receiving element 13. Specifically, the element controller 15 controls intensity and time of light emission by the light emitting element 11 and controls timing of image capturing by the light receiving element 13.

The system controller 16 controls the element controller 15 to cause repeated execution of light emission by the light emitting element 11 and light reception by the light receiving element 13, and cause the measurer 14 to repeatedly calculate the measurement value. The system controller 16 also controls the filtering device 20 to perform settings, for example, settings of parameters relating to filtering and settings about an output destination of the filtering result.

The filtering device 20 is a device that calculates an output value having a certain high level of followability for the measurement value while reducing noise included in the measurement value by filtering the measurement value. When the measurement value includes a variation different from noise, the filtering device 20 adaptively changes coefficients of the filter, thereby reducing a delay occurring when the output value follows the variation.

The filtering device 20 includes an acquirer 21 that acquires a measurement value, a filtering unit 22 that applies filtering to the measurement value, and an outputter 23 that outputs a result of the filtering.

The acquirer 21 acquires, as an input value, that is input to the filtering device 20, a measurement value that is repeatedly output by the measurer 14. A sampling period of the measurement value is, for example, 100 μs, 1 ms, or 10 ms. On each acquisition of the input value, the acquirer 21 outputs this input value to the filtering unit 22. The acquirer 21 serves as acquisition means in the claims.

The filtering unit 22 computes, by a moving average, an output value with noise reduced, from input values acquired in a certain past period. Specifically, the filtering unit 22 calculates as an output value an average value of n input values including the latest input values at the current point of time. The filtering unit 22 serves as filtering means in the claims.

Figure 2:
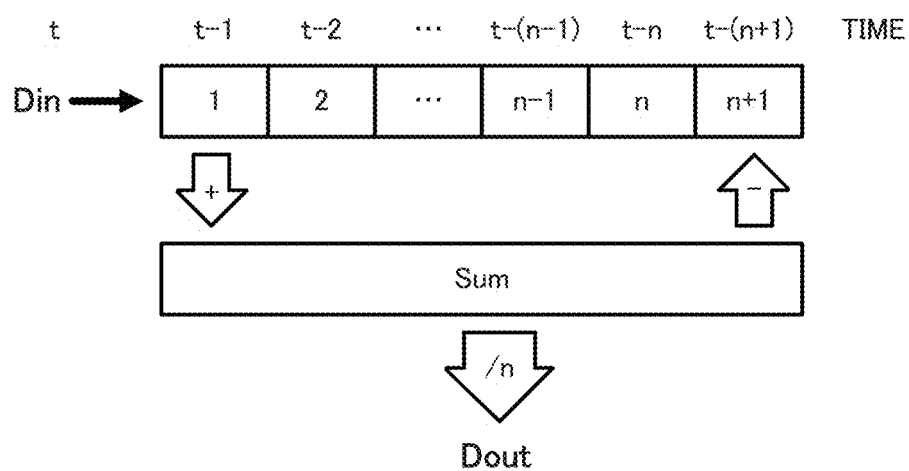
FIG. 2 is a diagram illustrating an overview of a moving average according to Embodiment 1.

FIG. 2 illustrates an overview of computation by the filtering unit 22. In FIG. 2, "Din" indicates an input value, and "Dout" indicates an output value. Upon new input of the input value Din, this input value Din is added to the first register in a list numbered "1" to "n+1". The list corresponds to a queue of a first-in-first-out structure, and an input value Din acquired immediately before the latest input value Din shifts to the second register, and in the third and subsequent registers, input values Din are stored in reverse chronological order. Thus, at a time t, the input value Din acquired at a time t−1 is stored in the first register, and the input Din acquired at a time t-n is stored in the n-th register. The time here corresponds to the sampling order. In the initial state prior to acquisition of the input value, zero is stored in each register. n is a data count of the input values that are subjected to the moving average.

Here, calculation of the output value by the moving average with the data count set to n is expressed by the following equation (1):

$$Dout_i = \frac{1}{n}\sum_{k=1}^{n} Din_{i-k+1} \tag{1}$$

Here, a subscript i in the above equation (1) indicates the number of the acquired input value, and Din, with a greater number of i is a newer input value. In the above equation (1), $Din_i$ means the current input value and $Din_{i-1}$ means the input value acquired immediately before $Din_i$. $Dout_i$ means the current output value and $Dout_{i-1}$ means the output value calculated immediately before $Dout_i$. The above equation (1) can be transformed into like the following equation (2):

$$Dout_i = \frac{1}{n}(n \cdot Dout_{i-1} + Din_i - Din_{i-n}) = Dout_{i-1} + \frac{1}{n}(Din_i - Din_{i-n}) \tag{2}$$

The above equation (2) indicates that the current output value is calculated by adding, to the last output value $Dout_{i-1}$, a value obtained by multiplying the current input value $Din_i$ by 1/n, and subtracting from the resulting value a value obtained by multiplying by 1/n an input value acquired n times ago. With this computation, the output value is calculated without access to each register storing the n input values every time the input value is acquired.

The register "Sum" in FIG. 2 stores the sum of values stored in the 1st to n-th registers. In this register, zero is stored in the initial state. To update the value of the sum, upon each acquisition of the input value Din, the filtering unit 22 adds the acquired input value Din to the first register and adds this value added to the first register to the value of the register "Sum", and subtracts a value shifted from the n-th register to the (n+1)th register from the value of the register "Sum". Then the filtering unit 22 obtains the output value Dout by dividing the value of the register "Sum" by n.

Figure 3:
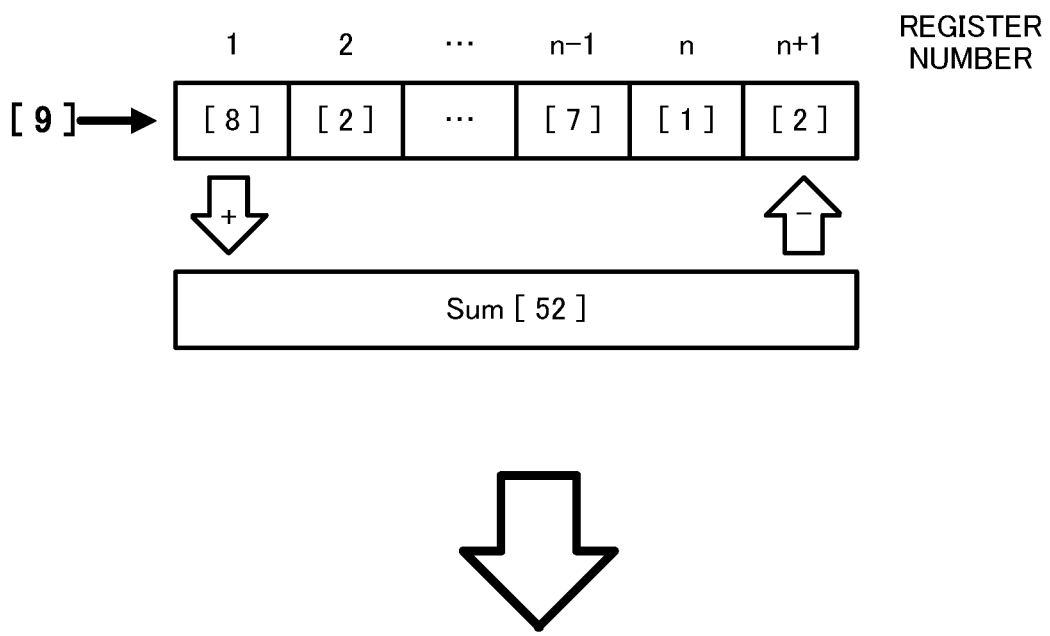
FIG. 3 is a diagram illustrating a detailed example of the moving average according to Embodiment 1.
Figure 3:
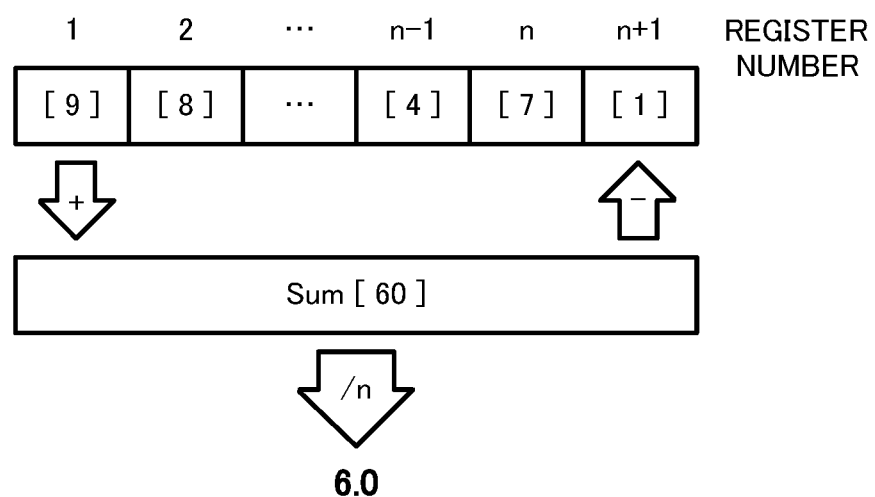

FIG. 3 illustrates an example of computation by the filtering unit 22. The upper part of FIG. 3 illustrates the first register stores the value "8" and the n-th register stores the value "1". The register "Sum" stores the sum "52" that is the sum of values stored in the 1st to n-th registers. Upon input of the new input value "9", this input value, as illustrated in the lower part of FIG. 3, is added to the first register and the value "1" is shifted from the n-th register to the (n+1)th register. Then the value "9" is added to the value "52" of the register "Sum" and the value "1" is subtracted therefrom, and the result "60" is thereby calculated. When the data count n is 10, the output value "6.0" is obtained.

Returning to FIG. 1, the outputter 23 outputs, under control of the system controller 16, the output value provided by the filtering unit 22. The output destination is, for example, a non-illustrated display terminal, a storage device, a signal processing circuit that applies signal processing to the output value of the filtering device 20, a programmable logic controller (PLC) connected to the sensor device 10 via a sensor network, or another control device.

Figure 4:
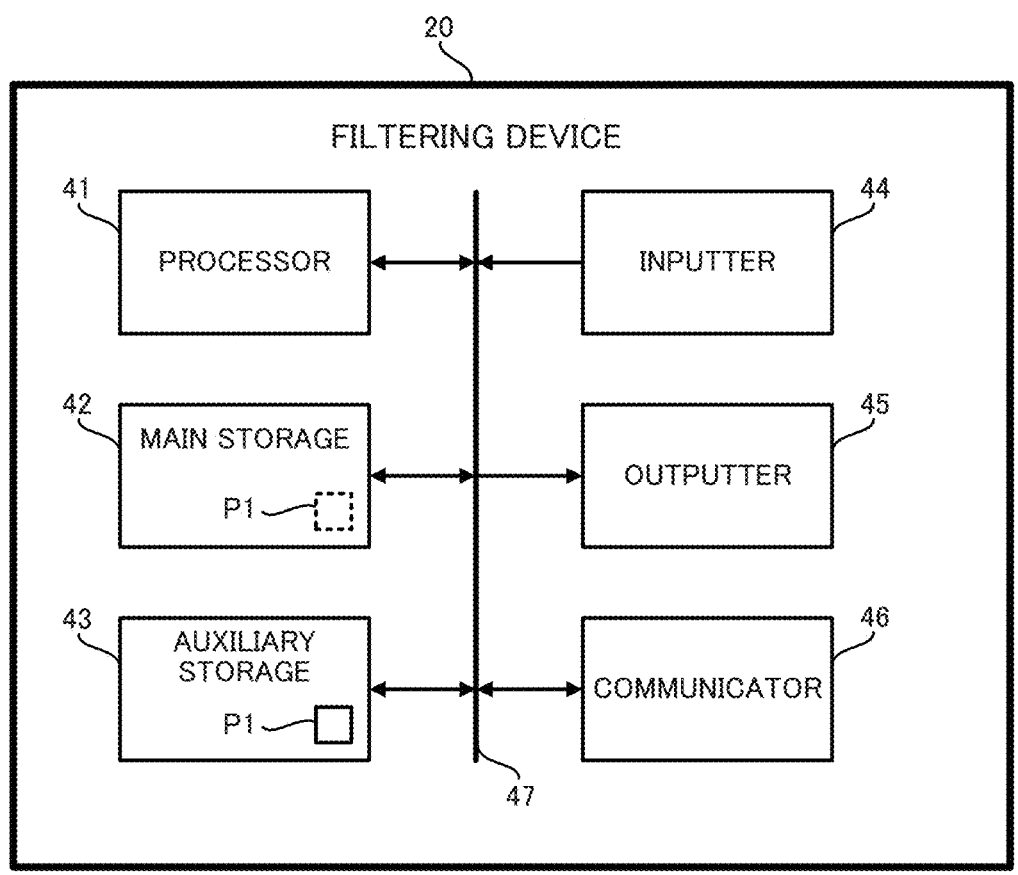
FIG. 4 is a diagram illustrating a hardware configuration of a filtering device according to Embodiment 1.

Next, a hardware configuration of the filtering device 20 is described with reference to FIG. 4. As illustrated in FIG. 4, the filtering device 20 includes a processor 41, a main storage 42, an auxiliary storage 43, an inputter 44, an outputter 45, and a communicator 46. The main storage 42, the auxiliary storage 43, the inputter 44, and the outputter 45, and the communicator 46 are all connected via an internal bus 47 to the processor 41.

Examples of the processor 41 includes a micro processing unit (MPU), a central processing unit (CPU), and a field programmable gate array (FPGA). The processor 41 implements various types of functions of the filtering device 20 to execute processing described later by executing a program P1 stored in the auxiliary storage 43.

The main storage 42 includes a random access memory (RAM). The program P1 is loaded from the auxiliary storage 43 into the main storage 42. Then the main storage 42 is used as a working area of the processor 41.

Examples of the auxiliary storage 43 include a non-volatile memory such as an electrically erasable programmable read-only memory (EEPROM) and a hard disk drive (HDD). In addition to the program P1, the auxiliary storage 43 stores various kinds of data for use in processing by the processor 41. The auxiliary storage 43, in accordance with an instruction of the processor 41, supplies to the processor 41 data for use by the processor 41, and stores data supplied from the processor 41.

The inputter 44 includes a terminal for input of information from the exterior of the filtering device 20. The inputter 44 acquires information input from the exterior, and notifies the processor 41 of the acquired information. The outputter 45 includes a terminal for output of information to the exterior of the filtering device 20. The outputter 45 outputs to the exterior the information supplied from the processor 41, in accordance with an instruction of the processor 41.

The communicator 46 includes a network interface circuit for communication with an exterior device. The communicator 46 receives a signal from the exterior and outputs to the processor 41 data indicated by this signal. The communicator 46 also transmits to the external device a signal indicating data output by the processor 41.

Various kinds of functions illustrated in FIG. 1 are implemented cooperatively by the hardware configuration illustrated in FIG. 4. Specifically, the acquirer 21 is implemented mainly by the inputter 44. The filtering unit 22 is implemented mainly by the processor 41 and the main storage 42. The outputter 23 is implemented mainly by the outputter 45. However, when the filtered result is sent as notification to an external device by communication, the communicator 46 may implement the outputter 23.

Next, a filtering process executed by the filtering device 20 is described with reference to FIG. 5. The filtering process illustrated in FIG. 5 starts upon powes of the filtering device 20.

In the filtering process, the filtering device 20 sets the first coefficient (1/n) to the initial value as initial processing (step S1). Specifically, the filtering unit 22 substitutes, as an initial value, 1 into the first coefficient that is the inverse of the data count n that is subjected to the moving average. The initial value of the data count n is thereby set to 1.

Here, the first coefficient (1/n) means a weight coefficient by which the current input value is multiplied. In a case in which the filtering unit 22 applies the moving average, each input value is divided by the data count n. This division is equivalent to multiplication of each input value by the coefficient 1/n. The coefficient 1/n corresponds to a weight of each input value and is a value in a range of from 0 to 1.

Next, the filtering device 20 acquires an input value (step S2). Specifically, the acquirer 21 acquires a measurement value output by the measurer 14. Step S2 corresponds to an acquisition step in the claims.

Then the filtering device 20 determines whether there is a past output value (step S3). Specifically, the filtering unit 22 determines whether there is an output value calculated prior to the output value calculated from the input value acquired in step S2. Here, the past output value usually means the previous output value.

Upon determination that there is no past output value (No in step S3), processing by the filtering device 20 goes to step S9. By contrast, upon determination that there is the past output value (Yes in step S3), the filtering device 20 determines whether a difference between the current input value and the past output value exceeds a threshold (step S4). Specifically, the filtering unit 22 calculates an absolute value of a difference between the current input value acquired in step S2 and the past output value to which determination is made in step S3 that there is the past output value, and determines whether this absolute value exceeds a predefined threshold. The threshold may be a value prestored by the filtering device 20 or a value modified by a user.

Upon determination that the difference does not exceed the threshold (No in step S4), the filtering device 20 determines whether the first coefficient is greater than the lower limit value (step S5). Specifically, the filtering unit 22 determines whether the current first coefficient 1/n is greater than the predefined lower limit value. The lower limit value may be a value prestored by the filtering device 20 or a value modified by a user. This lower limit value corresponds to the inverse of the maximum value of the data count that is subjected to the moving average. The lower limit value is, for example, $1/64$, $1/16384$, or $1/131072$. Immediately after start-up of the filtering device 20, the determination in step S5 is usually positive since the initial value of the coefficient is equal to 1 that is the upper limit value.

Upon determination that the first coefficient is not greater than the lower limit value (No in step S5), processing of the filtering device 20 goes to step S9 without the filtering device 20 changing the first coefficient.

By contrast, upon determination that the first coefficient is greater than the lower limit value (Yes in step S5), the filtering device 20 decreases the first coefficient (step S6). Specifically, the filtering unit 22 increments by one n of the first coefficient 1/n. In other words, the filtering unit 22 increases by 1 the data count n that is subjected to the moving average. Immediately after start-up of the filtering device 20, the data count n changes from 1 to 2, and the first coefficient decreases from 1 to $1/2$. Then processing by the filtering device 20 goes to step S9.

In step S4, upon determination that the difference exceeds the threshold (Yes in step S4), the filtering device 20 determines whether the first coefficient is less than the upper limit value (step S7). Specifically, the filtering unit 22 determines whether the current first coefficient 1/n is less than the predefined upper limit value. The upper limit value may be a value prestored by the filtering device 20 or a value modified by the user. This upper limit value corresponds to the inverse of the minimum value of the data count n that is subjected to the moving average. The upper limit value is 1, without particular limitation, and may be, for example, ⅛ or 1/64.

Upon determination that the first coefficient is not less than the upper limit value (No in step S7), processing by the filtering device 20 goes to step S9 without the filtering device 20 changing the first coefficient.

By contrast, upon determination that the first coefficient is less than the upper limit value (Yes in step S7), the filtering device 20 increases the first coefficient (step S8). Specifically, the filtering unit 22 changes the first coefficient 1/n to 1 by setting the data count n to 1. For the next acquired input value, the data count n that is subjected to the moving average is thereby only 1.

Then the filtering device 20 calculates an output value from a value obtained by multiplying the input value acquired in step S2 by the first coefficient 1/n (step S9). Specifically, the filtering unit 22 calculates the output value as a sum of a value obtained by multiplying the current input value by the first coefficient 1/n and a value obtained by multiplying each of the past (n−1) input values by the second coefficient 1/n. Here, in a simple moving average, the second coefficient equals the first coefficient. The second coefficient means a weight coefficient by which the past input value is multiplied. Step S9 corresponds to a filtering step in the claims.

Although the filtering device 20 has yet to acquire the past input value immediately after start-up, the filtering device 20 uses the input value acquired in step S2 as an output value since the data count n is set to 1 in step S1.

Then the filtering device 20 repeats processing of step S2 and thereafter. The filtering device 20 thereby calculates the output value with noise reduced, while changing the first coefficient relative to the input values acquired repeatedly.

Figure 6:
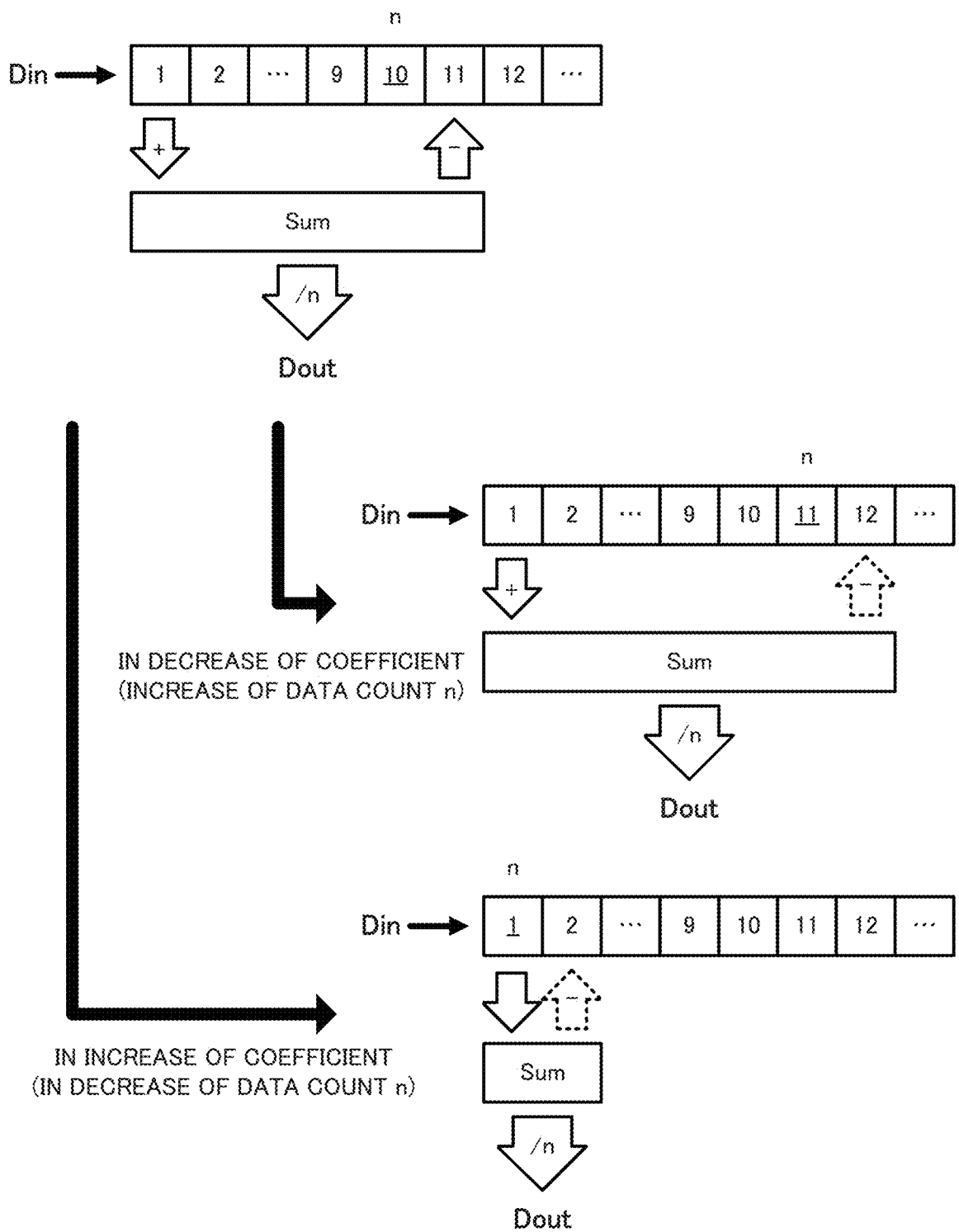
FIG. 6 is a diagram for describing change of a data count according to Embodiment 1.

FIG. 6 schematically illustrates change of the data count n that is subjected to the moving average. The upper part of FIG. 6 illustrates a case in which the data count n is 10. Here, when the data count n is increased and the first coefficient is decreased, the data count n changes to 11, and computation is executed as illustrated in the middle part of FIG. 6. However, immediately after increase of the data count n, subtraction from the value of the register "Sum" is omitted, and only addition of a new input value is executed.

When the data count n is decreased and the first coefficient is increased, the data count n changes to 1, and computation is executed as illustrated in the lower part of FIG. 6. However, immediately after decrease of the data count n, the new input value is stored in the register "Sum" as is.

As described above, when the difference between the current input value and the past output value exceeds a threshold, the filtering device 20 obtains a new output value by weighting the current input value with a weight greater than a weight for obtaining the past output value. The greater weight of the current input value decreases the contribution of the other data, thereby enabling a reduction in the delay. This can improve responsiveness while ensuring filtering performance for noise reduction to some extent.

Specifically, the filtering device 20 calculates the output value from a value obtained by multiplying the current input value by the first coefficient 1/n. The first coefficient corresponds to the degree of emphasis placed on the current input value. A greater first coefficient decreases the contribution of the other data and reduces the delay, while conversely, a smaller first coefficient uses an increased amount of other data and further reduces noise. When the difference between the current input value and the past output value is large, the filtering device 20 increases the first coefficient to reduce delay, and when the difference is small, the filtering device 20 decreases the first coefficient to reduce noise. This can improve filtering performance for noise reduction in accordance with circumstances. This in turn contributes to improvements in productivity of a production facility that uses the filtering device 20 and improvements in product quality.

Figure 7:
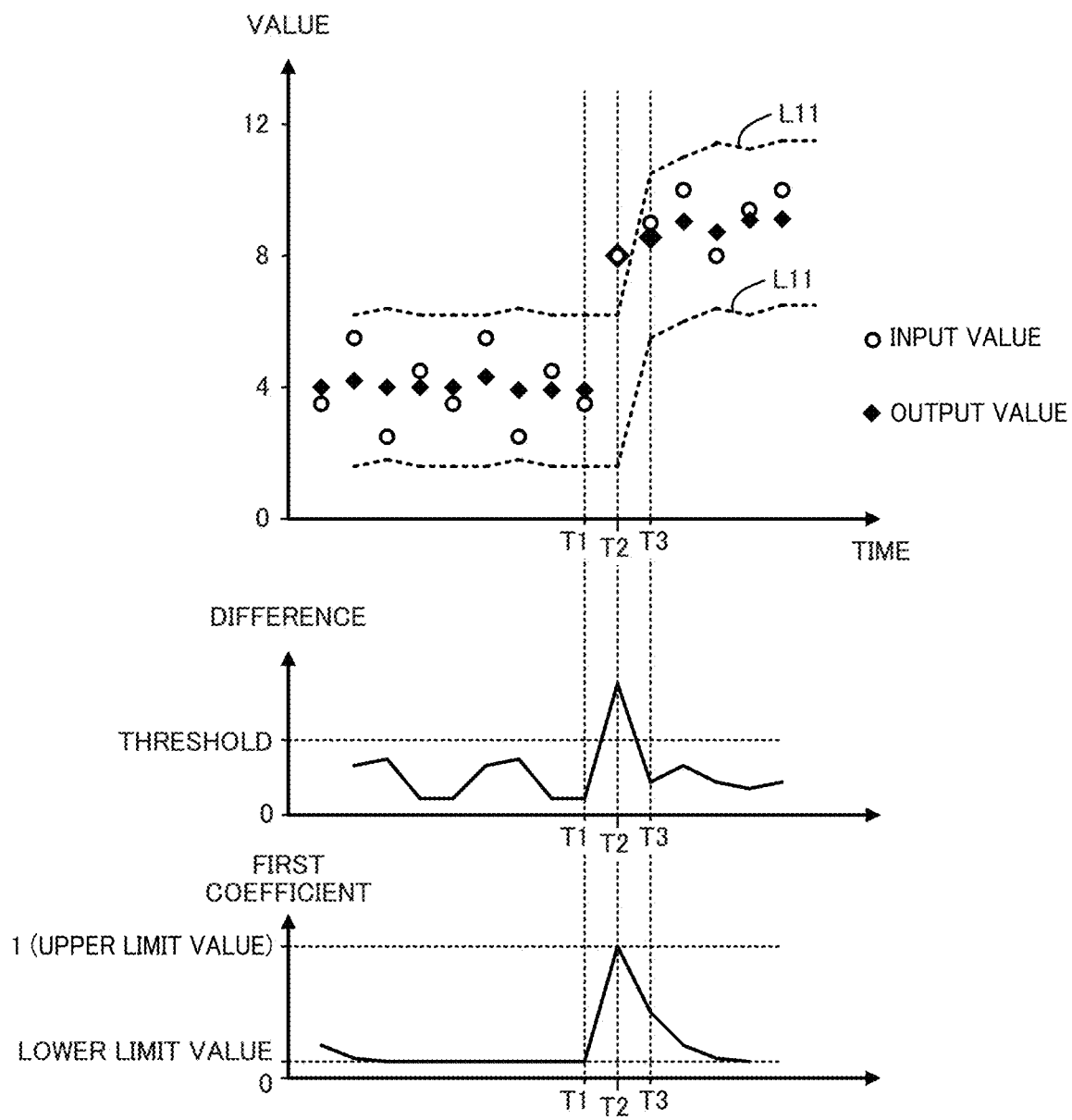
FIG. 7 is a diagram for describing filtering according to Embodiment 1.

FIG. 7 schematically illustrates a transition of the input value and the output value, a transition of the difference between the input value and the previous output value, and a transition of the first coefficient. Broken lines L11 in the upper part of FIG. 7 indicate transitions of values that are separated from the previous output values by the threshold. When the input value is out of the range between the two broken lines L11, the determination of step S4 in FIG. 5 is positive.

As illustrated in FIG. 7, till a time T1, the difference between the previous output value and the input value is equal to or less than the threshold, and the first coefficient converges to the lower limit value. At a time T2, since the difference between the previous output value and the input value exceeds the threshold, the data count n is changed to 1 so that the first coefficient increases to 1, and a newly calculated output value equals the input value. Then at the subsequent time T3, the data count n increases to 2 so that the first coefficient decreases to ½, and the input values are subjected to the moving average again. As illustrated in FIG. 7, even when the input values include a change different from noise, the output values can follow this change with low delay.

The filtering device 20 calculates the output value by the moving average, and increase and decrease the data count of the past input values that are subjected to the moving average in accordance with the difference between the past output value and the current input value. Since the moving average is relatively easy to implement and is an effective method for noise reduction, the filtering device 20 can easily improve noise reduction performance.

The filtering device 20 sets the initial value of the first coefficient 1/n to 1. In a typical moving average, since input values of the data count n that are subjected to the moving average are yet to be entered immediately after the start of filtering, the output value is not a proper value, and thus special processing is required immediately after the start. In contrast, in the filtering device 20, since the initial value of the data count n is set to 1 and the output value equals the input value, a proper output value can be easily obtained.

In a case in which the first coefficient 1/n is a value in a range of from 0 to 1 and the difference between the past output value and the current input value exceeds the threshold, the filtering device 20 sets the first coefficient to 1. Thus, as the difference between the past output value and the current input value is large, a newly calculated output value equals the input value, and the output value can be made to follow the input value with low delay.

The filtering process by the filtering device 20 is not limited to the above-described process.

Figure 5:
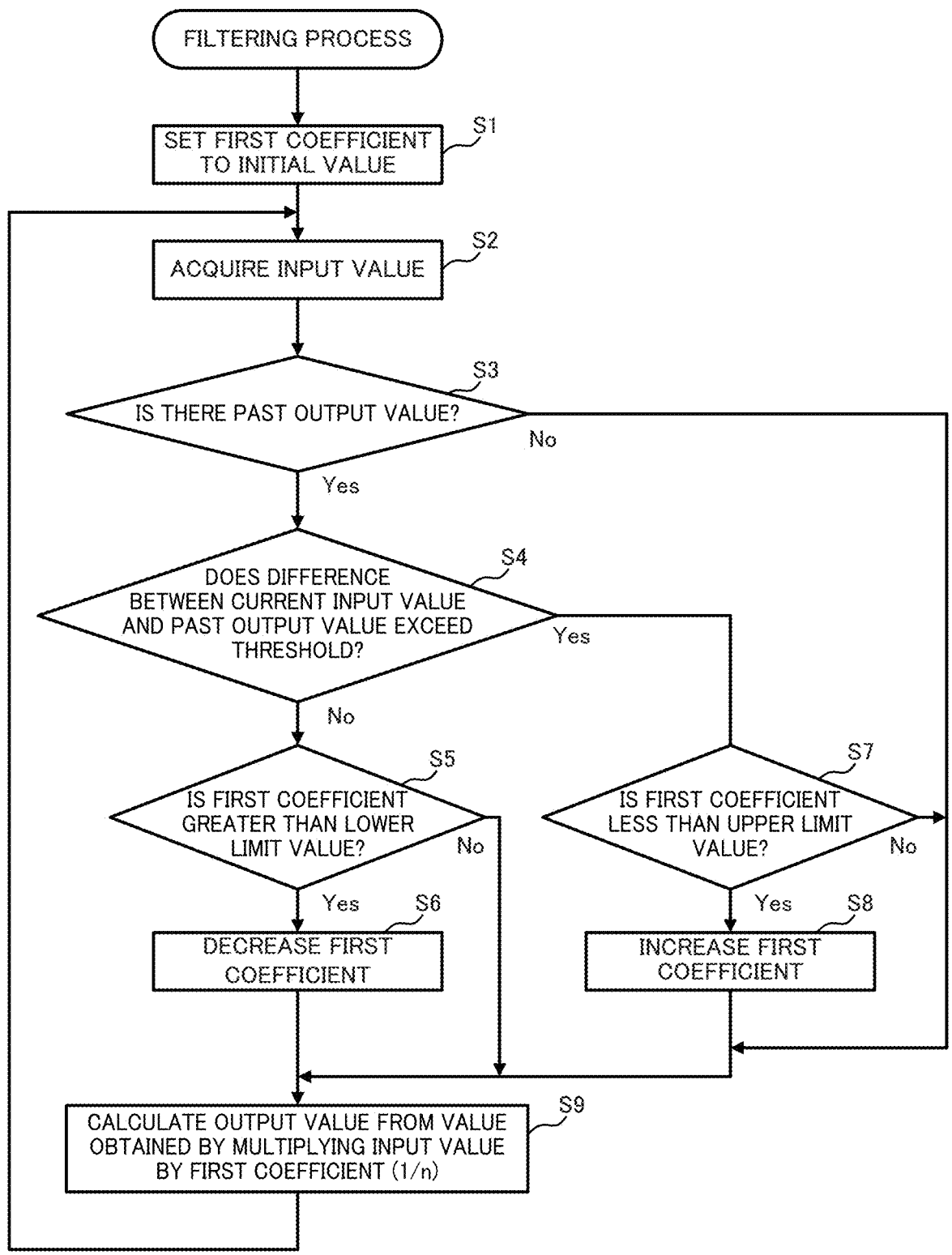
FIG. 5 is a flow chart illustrating a filtering process according to Embodiment 1.
Figure 8:
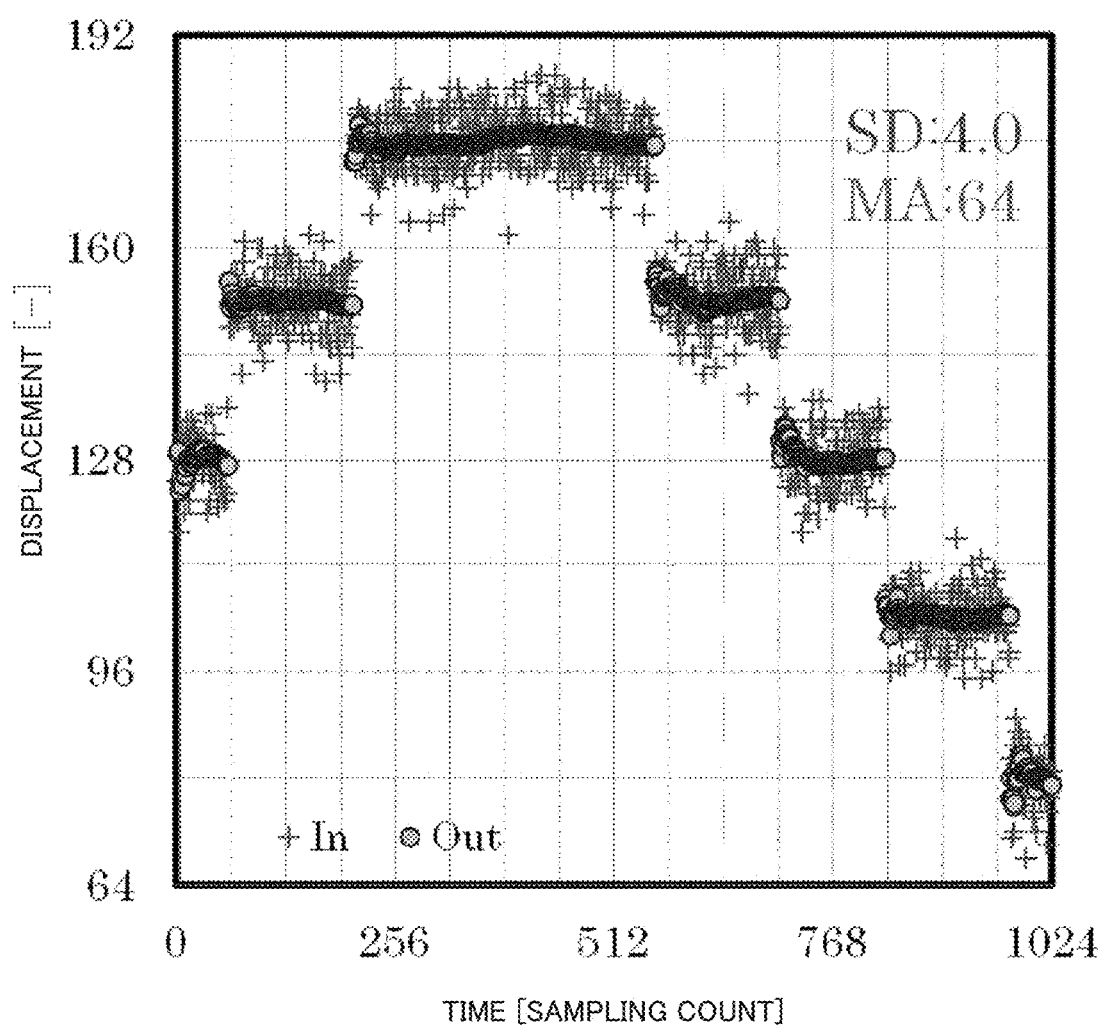
FIG. 8 is a diagram for describing filtering according to a modified example of Embodiment 1.

For example, although incrementing of the data count n by 1 and decreasing of the first coefficient are described in step S6 of FIG. 5, such an amount of decrease of the first coefficient is not limiting, and the first coefficient may be decreased by doubling the data count n. Doubling of the data count n makes the data count n a multiple of 2, which makes computation easy. FIG. 8 illustrates a result of simulation by the inventors for the input value and the output value obtained in a case in which the data count n is doubled. In this simulation, a value that is a stepped-varying amount of displacement with noise superimposed is used as an input value. In FIG. 8, "In" indicates an input value and "Out" indicates an output value. FIG. 8 shows that the output values transition in a stepped manner, and the output values follow changes different from noise included in the input values, with low delay while reducing noise by the filtering process.

Figure 9:
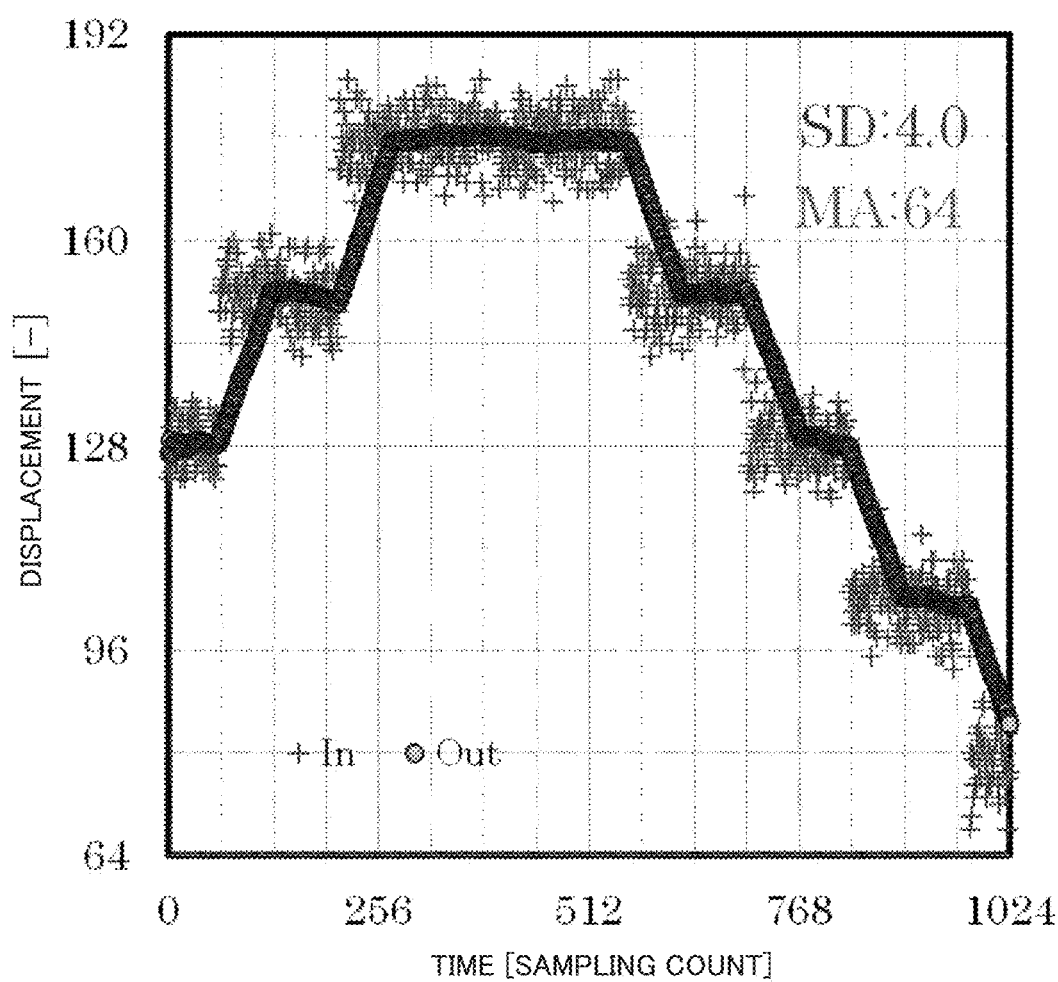
FIG. 9 is a diagram illustrating a comparative example relative to the modified example of Embodiment 1.

FIG. 9 illustrates a result of the moving average in a case in which the data count n is fixed to 64 without changing the first coefficient, under the same conditions as those of the simulation in FIG. 8. The example of FIG. 9 shows that the output value reduces noise to approximately ⅛, but delays, corresponding to 64 samplings, occur relative to the input value.

Figure 10:
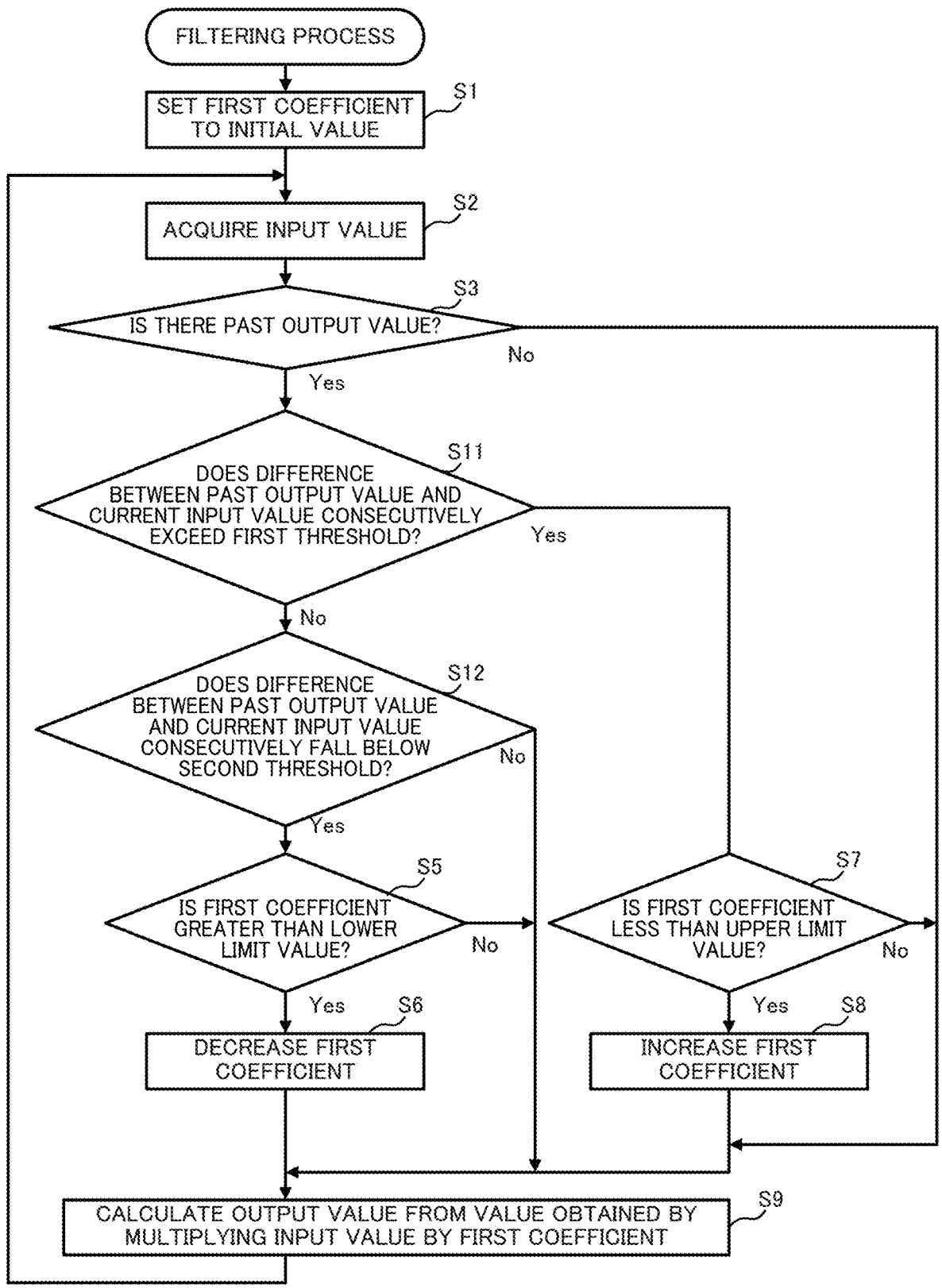
FIG. 10 is a flow chart illustrating a filtering process according to the modified example of Embodiment 1.

Alternatively, the filtering process of FIG. 5 may be modified as in a modified example of FIG. 10. In the filtering process of FIG. 10, the filtering device 10 determines, following step S3, whether a difference between the output value and the input value consecutively exceeds the first threshold (step S11). Specifically, the filtering unit 22 determines whether the difference exceeds the first threshold consecutively a predefined number of times or more. At this time, the output value exceeding the threshold is stored and subsequently determination is made sequentially based on a difference between the input and the stored output. Specifically, the output value that is a value when the difference between the input value and the output value exceeds the first threshold is stored as a reference value, and for the next and subsequent input value, determination is made whether an error between the input value and the reference value consecutively falls within a range of a predetermined error. The predefined number of times is, for example, 3, 10, or 100, and may be the number of times prestored by the filtering device 20 or may be modified by the user. The first threshold is a threshold for determining whether the first coefficient is to be increased, and may be a value prestored by the filtering device 20 or may be modified by a user.

Upon determination that the difference consecutively exceeds the first threshold (Yes in step S11), processing by the filtering device 20 shifts to step S7. By contrast, upon determination that the difference does not consecutively exceed the first threshold (No in step S11), the filtering device 20 determines whether the difference between the output value and the input value consecutively falls below the second threshold (step S12). Specifically, the filtering unit 22 determines whether the difference falls below the second threshold consecutively a predefined number of times or more. This number of times may be the same as the number of times for use in step S11 or may be different. This number of times is, for example, 3, 10, or 100, and may be the number of times prestored by the filtering device 20 or may be modified by the user. The second threshold is a value different from the first threshold, and is a threshold for determining whether to decrease the first coefficient. The second threshold may be a value prestored by the filtering device 20 or may be modified by a user. Usually, a value greater than the first threshold is set as the second threshold.

Upon determination that the difference consecutively falls below the second threshold (Yes in step S12), processing by the filtering device 20 shifts to step S5. By contrast, upon determination that the difference does not consecutively fall below the second threshold (No in step S12), the processing by the filtering device 20 shifts to step S9. The filtering device 20 thereby calculates the output value with noise reduced, while changing the first coefficient relative to the input values acquired repeatedly.

In the modified example of FIG. 10, the first threshold for decreasing the first coefficient is set as a different value from the second threshold for increasing the first coefficient. When the difference between the output value and the input value is greater than the first threshold and less than the second threshold, the first coefficient is not changed. Thus, when the difference between the output value and the input value is stable within a certain range, the first coefficient is fixed, and faster computation processing can be easily achieved. The example illustrated in FIG. 5 can be said to be a case in which the first threshold equals the second threshold.

In the modified example of FIG. 10, when the difference between the output value and the input value consecutively exceeds the first threshold and consecutively falls below the second threshold, the first coefficient is changed. This avoids changing of the first coefficient every time the input value varies greatly due to transient noise. The computation processing can be thus performed stably.

An example is described in which the first coefficient by which the current input value is multiplied is equal to the second coefficient by which the past input value is multiplied, but the first coefficient and the second coefficient each may be a value different from the one described above. However, the first coefficient and one or more second coefficients are each a positive value, and preferably fall within a range of from 0 to 1. In addition, the sum of the first coefficient and the one or more second coefficient is preferably 1. Each of the second coefficients may have a different value.

Embodiment 2

Next, Embodiment 2 is described with focus on points different from those in Embodiment 1 described above. Components that are identical or similar to the components of the above embodiment are given the same reference signs, and further description is omitted or simplified. In Embodiment 1 above, filtering based on the moving average is applied to the input values, but an embodiment using IIR filtering can also be considered. An example of applying the IIR filter to the input value is described below.

Figure 11:
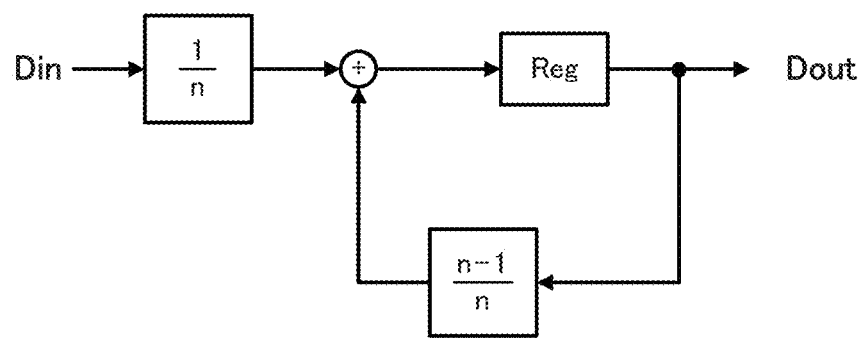
FIG. 11 is a first diagram for describing an IIR filter according to Embodiment 2.

FIG. 11 illustrates an overview of computation by the filtering unit 22 according to the present embodiment. In the block diagram of FIG. 11, "Reg" indicates a recording operation in a register. In this computation, the sum of a value obtained by multiplying the current input value $Din_i$ by the first coefficient $1/n$ and a value obtained by multiplying the past output value $Dout_{i-1}$ by a third coefficient $(n-1)/n$ is output as a new output value $Dout_i$. This computation is represented by the following equation (3). The third coefficient is a weight coefficient by which the past output value is multiplied.

$$Dout_i = \left(\frac{n-1}{n}\right)Dout_{i-1} + \frac{1}{n}Din_i \quad (3)$$

According to the computation of the filtering unit 22, an inner product of each of the previous output value and the current input value is taken to calculate the current output value. In other words, a new output value is calculated as a weighted average of the current input value and the past output value. The output value corresponds to a weighted average of the past input value. Then the current input value is multiplied by the first coefficient 1/n. Thus an output value following the current input value with low delay can be obtained by increasing the first coefficient 1/n, and by reducing the first coefficient 1/n, noise can be reduced further by weighted averaging of the past input values.

Figure 12:
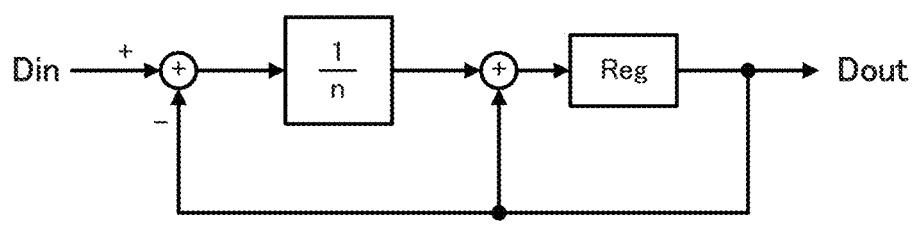
FIG. 12 is a second diagram for describing the IIR filter according to Embodiment 2.

The computation by the filtering unit 22 can be implemented as illustrated in a block diagram in FIG. 12. The computation of the output value illustrated in the example of FIG. 12 is represented by the following equation (4) into which the above equation (3) is transformed.

$$Dout_i = Dout_{i-1} + \frac{1}{n}(Din_i - Dout_{i-1}) \quad (4)$$

As described above, the filtering device 20 according to the present embodiment calculates the current output value as a weighted average of the current input value and the past output value. This enables the filtering device 20 to execute processing similar to that of FIG. 5 and exhibit an effect equivalent to that of Embodiment 1 described above.

Figure 13:
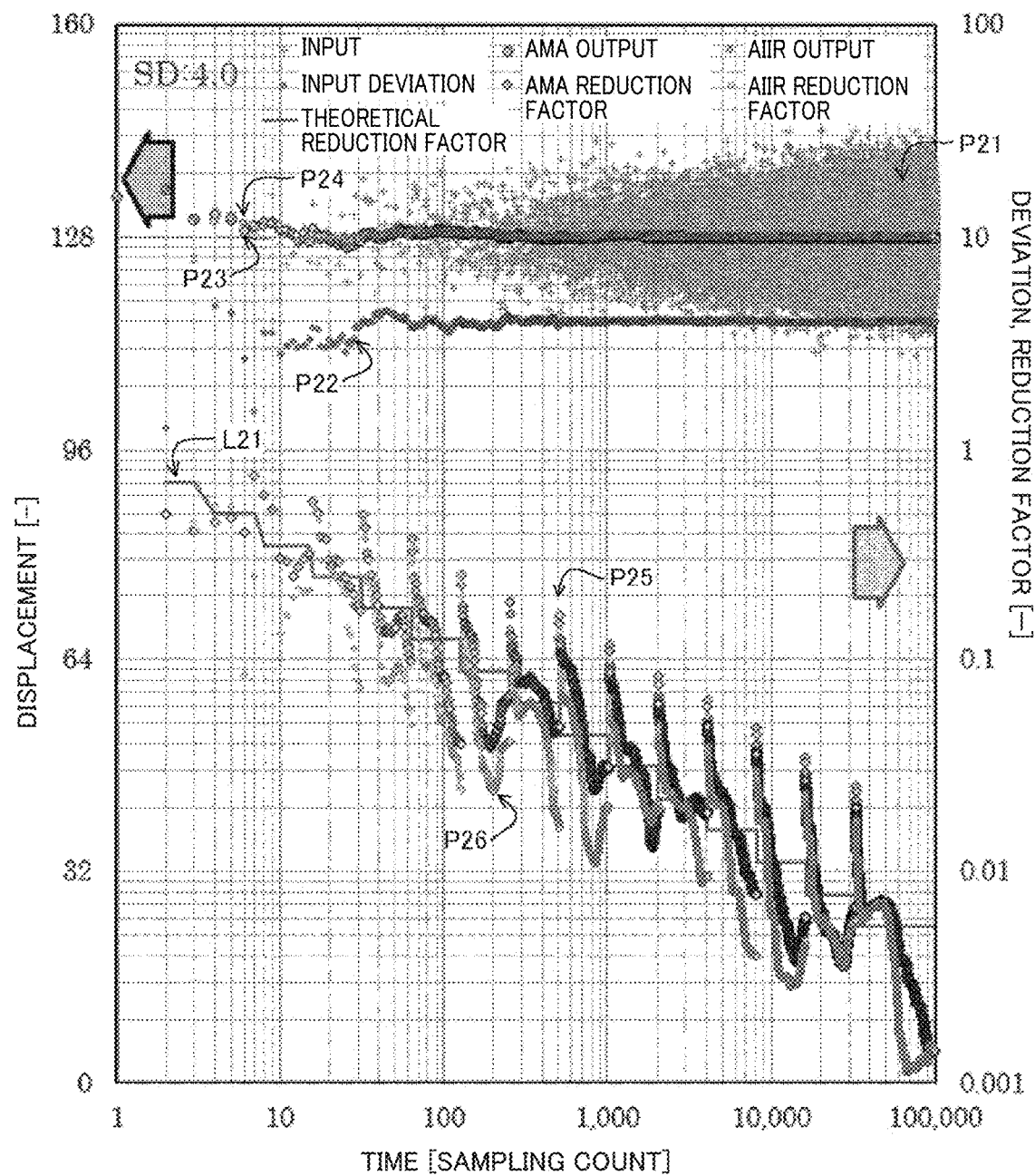
FIG. 13 is a diagram for illustrating filtering according to Embodiment 2.

FIG. 13 illustrates a result of comparison, by the inventors, between the IIR filter and the moving average in a case in which the data count n is doubled. In FIG. 13, a point P21 represented by "+" indicates an input value, a rhombic point P22 indicates a standard deviation of the input value, a large circle point P23 indicates an output value by the moving average, and small circle point P24 indicates an output value by the IIR filter. A line L21 indicates a theoretical noise reduction factor $1/\sqrt{n}$, a large rhombic point P25 indicates a noise reduction factor by the moving average, and a small rhombic point P26 indicates a noise reduction factor by the IIR filter. As seen from FIG. 13, even with the IIR filter, noise can be reduced approximately in keeping with the theoretical reduction factor, similarly to the moving average. The noise reduction factor by the moving average and by the IIR filter is calculated as a (standard deviation of output values)/(standard deviation of input values).

According to the IIR filter, preparation of just a single register enables computation, as illustrated in FIGS. 11 and 12. The filtering processing can be thereby executed with hardware resources less than those of the moving average that requires registers as illustrated in FIG. 2.

An example is described in which a new output value is calculated using only a single past output value, but a new output value may be calculated using a plurality of past output values. An example is described in which the first coefficient by which the current input value is multiplied is 1/n and the third coefficient by which the past output value is multiplied is (n−1)/n, but the first coefficient and the third coefficient each may be a value different from the one described above. However, the first coefficient and one or more third coefficients are each a positive value, and preferably fall within a range of from 0 to 1. In addition, the sum of the first coefficient and the one or more third coefficients is preferably 1. Each of the third coefficients may have a different value.

Embodiment 3

Next, Embodiment 3 is described with focus on points different from those in Embodiment 1 described above. Components that are identical or similar to the components of the above embodiment are given the same reference signs, and further description is omitted or simplified. In Embodiment 1 described above, the threshold is set to a predetermined parameter, but this threshold is preferably defined in accordance with the level of noise. Then an example in which the threshold is determined in accordance with the level of noise is described hereinafter.

Figure 14:
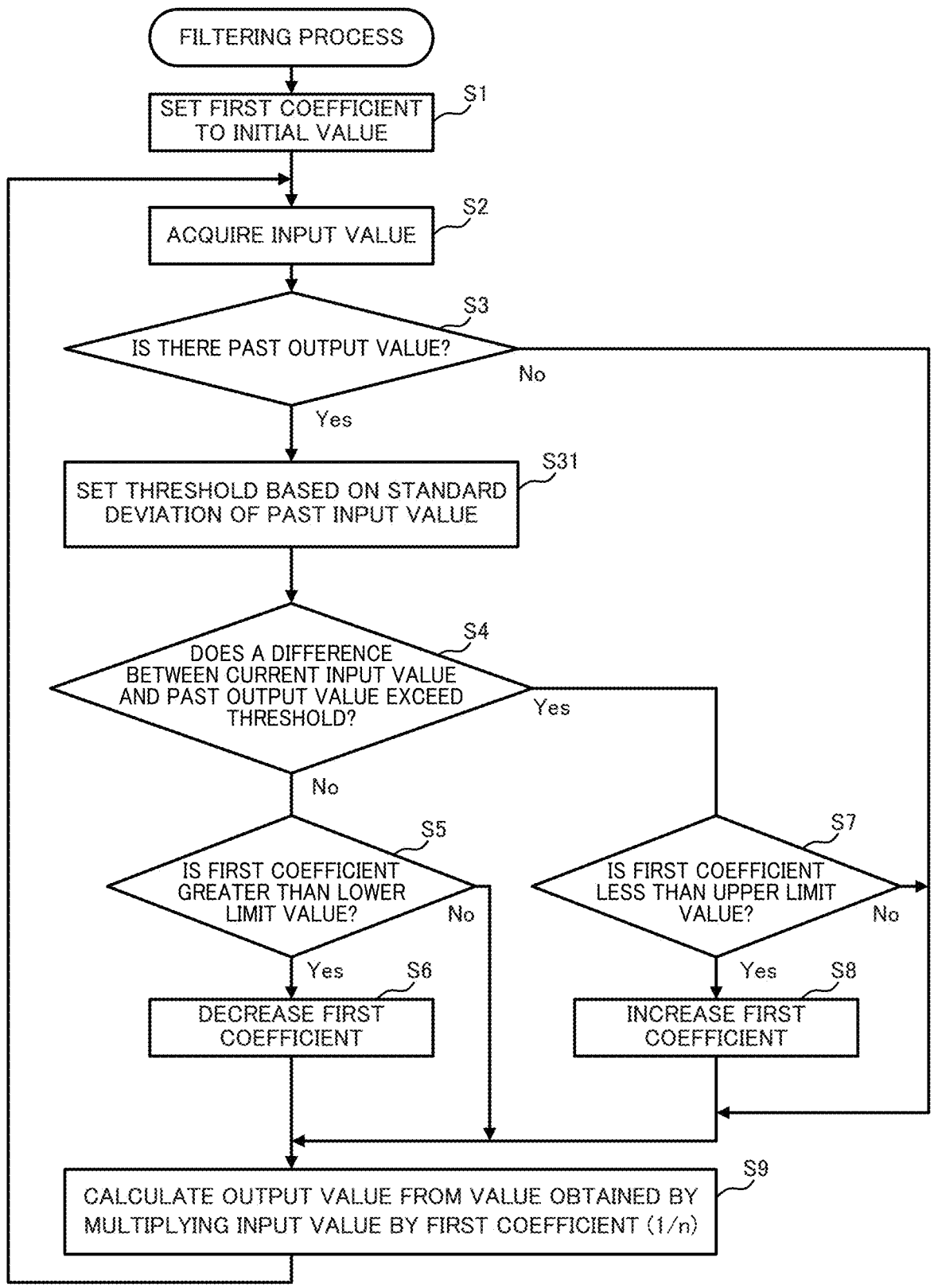
FIG. 14 is a flow chart illustrating a filtering process according to Embodiment 3.

A filtering device 20 according to the present embodiment executes a filtering process illustrated in FIG. 14. In this filtering process, the filtering device 20 sets, following step S3, a threshold based on a standard deviation of the past input value (step S31). Specifically, the filtering unit 22 calculates the standard deviation of predefined P input values and sets as a threshold a value that is Q times the calculated standard deviation.

Here, the P and Q values each may be a value prestored by the filtering device 20 or may be modified by the user. Preferably, P is the number of times that is large enough to obtain an effective standard deviation and, for example, is 32, 64, or 128. Alternatively, Q is preferably defined in accordance with the level of noise or an amount of displacement of a measurement target. For example, when the amount of displacement changes in a stepped manner and this amount of displacement is significantly larger than noise, an output value following displacement with low delay while reducing noise can be obtained by setting P to a relatively higher value. As such a P, for example, 3 or 4 can be considered.

As described above, the filtering device 20 according to the present embodiment calculates a threshold from the standard deviation of the input values and changes the first coefficient based on the threshold. Even when a level of noise varies over time, proper filtering can be thereby applied by changing the first coefficient using a proper threshold in accordance with the level of noise.

Figure 15:
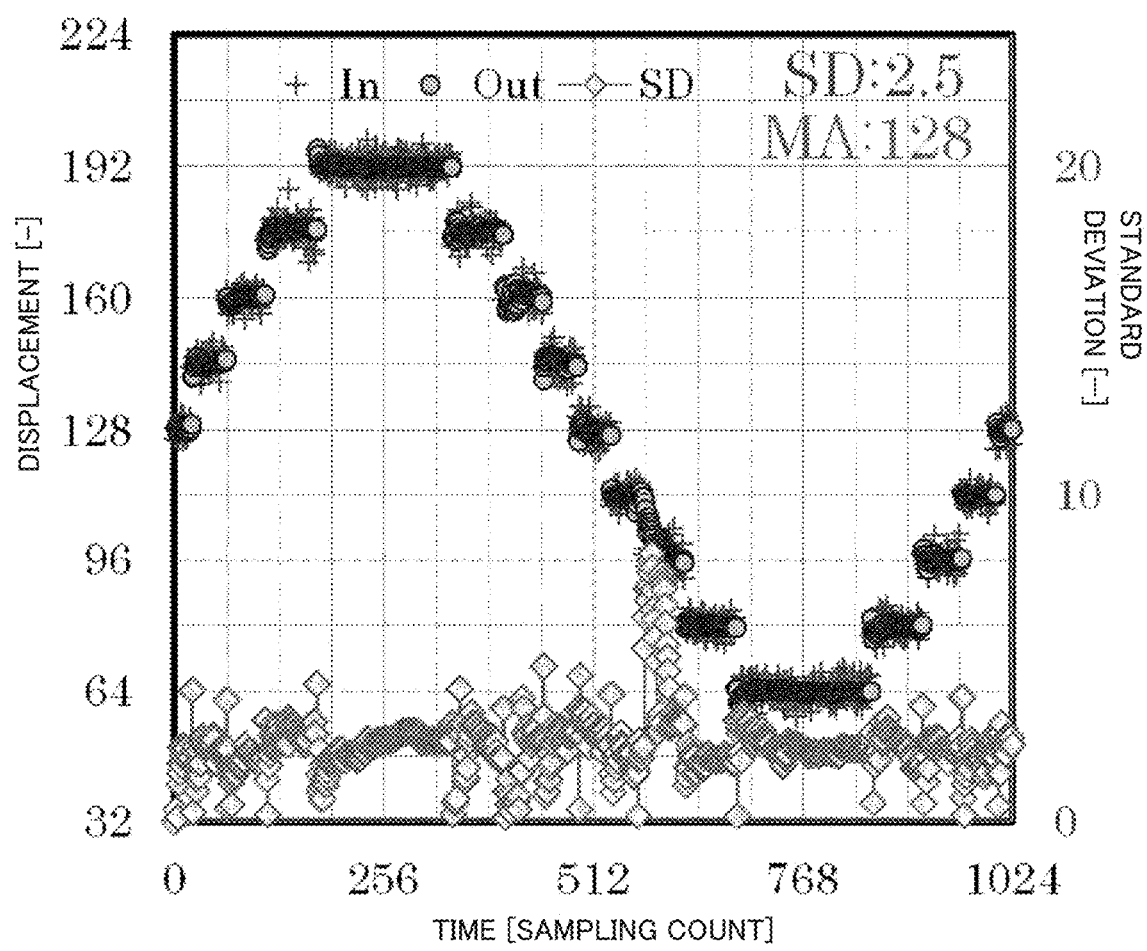
FIG. 15 is a diagram describing filtering according to Embodiment 3.

FIG. 15 illustrates a result of simulation by the inventors for the input value, the output value, and the standard deviation in a case in which the threshold is defined in accordance with the standard deviation of the past input value. In FIG. 15, "SD" indicates standard deviation. In this simulation, a value that is a stepped varying amount of displacement with noise superimposed thereon is used as an input value. As illustrated in FIG. 15, the output value can follow the stepped-varying amount of displacement with low delay. The output value shifts in a stepped manner, and noise reduction can be achieved.

An example is described in which the threshold in Embodiment 1 described above is defined in accordance with the standard deviation, but the first threshold and the second threshold in the modified example of FIG. 10 may be defined in accordance with the standard deviation. Alternatively, even when the IIR filter is used instead of the moving average in Embodiment 2 described above, the threshold can be defined in accordance with the standard deviation.

This is not limited to the standard deviation, and the threshold may be defined in accordance with a statistical value regarding dispersion of at least one of the past input value and the output value. As such a statistical value, it is considered that the threshold can be defined in accordance with one or more of dispersion of the difference between the output value and the input value, a peak value or a peak position in a histogram of the difference, a deviation of this difference, and time variations in a statistical value regarding the histogram.

Although some embodiments of the present disclosure are described above, the present disclosure is not limited to the above embodiments.

For example, an example is described in which the sensor device 10 is a laser displacement device, but the sensor device 10 is not limited thereto and may be another sensing device.

The inputter 44 and the outputter 45 of the hardware configuration of FIG. 4 may form a user interface that receives and provides information relative to the user.

The amount of change when changing the first coefficient is not limited to the aforementioned example, but rather may be freely set by the user. The initial value of the first coefficient is not limited to the aforementioned example, but rather may be freely set by the user.

An example is described in which the filtering device 20 is incorporated into the sensor device 10, but this example is not limiting. For example, the sensor device 10 and the filtering device 20 may be configured as different devices. It can be considered that the sensor device 10 and the filtering device 20 are integrally included. In this case, the measurer 14 may be implemented by use of the processor 41, and the acquirer 21 and the measurer 14 may be integrally formed.

The filtering device 20 according to Embodiments 1 and 2 described above may calculate the output value according to the following equation (5):

$$Dout_i = a_0 Din_i + \sum_{k=1}^{k=N} a_k Din_{i-k} + \sum_{m=1}^{m=M} b_m Dout_{i-m} \quad (5)$$

Note that in the equation (5) above, $Dout_i$ is a newly calculated output value, $Din_i$ is the current input value, $a_0$ is the first coefficient, $Din_{i-k}$ is the past input value, $a_k$ is the second coefficient, $Dout_{i-m}$ is the past output value, and $b_m$ is the third coefficient. Only either one of the second term including $a_k$ and the third term including $b_m$ on the right side of the above equation (5) is effective. In other words, one of $a_k$ and $b_m$ is a positive value and the other is zero. Embodiment 1 described above corresponds to a case in which the third term on the right side of the equation (5) is omitted and $a_0=a_k=1/n$. In this case, the data count that is subjected to the moving average is K+1. Embodiment 2 described above corresponds to a case in which the second term on the right side of the equation (5) is omitted and M=1. In this case, $a_0=1/n$ and $b_1=(n-1)/n$.

In the equation (5) described above, the count K of the past input values for use in computation and the count M of the past output values for use in computation may be freely set.

When changing the first coefficient in accordance with the current input value, the filtering device 20 calculates a new output value from the current input value using the changed first coefficient, but this configuration is not limiting. For example, the first coefficient with the value changed may be applied to the next and beyond input values.

Dedicated hardware or a general computer system can be used to implement functions of the filtering device 20.

For example, the program P1 executed by the processor 41 is stored in a non-transitory computer-readable storage medium for distribution and the program P1 is installed in a computer, thereby achieving a device that executes the aforementioned processing. Possible examples of such a storage medium include a flexible disc, a compact disc read-only memory (CD-ROM), a digital versatile disc (DVD), and a magneto-optical disc (MO).

The program P1 may be stored in a disk device included in a server device on a communication network such as the Internet, and may be downloaded into a computer, for example by being superimposed on a carrier wave.

The aforementioned processing can be achieved by starting up and executing the program P1 while transferring via the communication network.

In addition, the aforementioned processing can be achieved by running the entirety or a part of the program P1 on the server device and executing the program while the computer receives and transmits information relating to the processing via the communication network.

For example, when the aforementioned functions are implemented partly by an operating system (OS) or in cooperation between the OS and the application, the program other than the OS may be stored on the recording medium and distributed, or may be downloaded into a computer.

Means for implementing the functions of the filtering device 20 is not limited to software, and a part or the entirety of the functions may be implemented by using dedicated hardware including a circuit.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

INDUSTRIAL APPLICABILITY

The present disclosure is suitable for filtering for noise reduction.

REFERENCE SIGNS LIST

10 Sensor device
11 Light emitting element
12 Lens
13 Light receiving element
14 Measurer
15 Element controller
16 System controller
20 Filtering device
21 Acquirer
22 Filtering unit
23 Outputter
30 Workpiece
41 Processor
42 Main storage
43 Auxiliary storage
44 Inputter
45 Outputter
46 Communicator
47 Internal bus
L11 Broken line
L21 Line
P1 Program
P21 to P26 Point

The invention claimed is:

1. A filtering device comprising:
   a processer configured to acquire an input value that is repeatedly input, the input value being a magnitude value based on a measurement of a displacement of a workpiece arranged in proximity to the filtering device; and
   the processor further configured as a filter to obtain an output value by filtering for reduction of noise included in the input value, wherein
   when a difference between a current input value acquired by the processor and a past output value obtained by the filter exceeds a first threshold, the filter obtains a new output value by weighting the current input value with a weight greater than a weight for obtaining the past output value,
   and the processor is further configured to determine the displacement of the workpiece based on the new output value,
   the filter calculates the output value by a moving average, and when the difference exceeds the first threshold, increases the weight of the current input value by decreasing a count of the input values that are subjected to the moving average, and then calculates the new output value, and
   the weight of the current input value equals an inverse of the count of the input values that are subjected to the moving average.

2. The filtering device according to claim 1, wherein when the difference falls below a second threshold, the filter obtains a new output value by weighting the current input value with a weight smaller than the weight for obtaining the past output value.

3. The filtering device according to claim 1, wherein the filter sets an initial value of the weight of the current input value to 1.

4. The filtering device according to claim 1, wherein
   the weight of the current input value is a value in a range of from 0 to 1, and
   the filter sets the weight of the current input value to 1 when the difference exceeds the first threshold.

5. The filtering device according to claim 1, wherein the filter increases the weight of the current input value when the difference consecutively exceeds the first threshold.

6. The filtering device according to claim 1, wherein the first threshold value is defined based on a statistical value relating to the past input value.

7. A sensor device comprising:
   processing circuitry configured to repeatedly output a measurement value; and
   the filtering device according to claim 1, that applies filtering for reduction of noise to the measurement value.

8. The filtering device according to claim 1, wherein the input value is calculated based on a location of a peak intensity in a distribution of light intensity received by an array of photoelectric conversion elements from light reflected by the workpiece.

9. A filtering method comprising:
   acquiring an input value that is repeatedly input, the input value being a magnitude value based on a measurement of a displacement of a workpiece arranged in proximity to the filtering device; and
   applying filtering to reduce noise included in the input value to obtain an output value, wherein
   in the applying, when a difference between a current input value acquired in the acquiring and a past output value obtained in the applying exceeds a first threshold, obtaining a new output lue by weighting the current input value with a weight different from a weight for obtaining the past output value, and
   the method further comprising determining the displacement of the workpiece based on the new output value,
   the filtering calculates the output value by a moving average, and when the difference exceeds the first threshold, increases the weight of the current input value by decreasing a count of the input values that are subjected to the moving average, and then calculates the new output value, and
   the weight of the current input value equals an inverse of the count of the input values, that are subjected to the moving average.

10. A non-transitory computer-readable recording medium storing a program causing a computer to:
    acquire an input value that is repeatedly input, the input value being a magnitude value based on a measurement of a displacement of a workpiece arranged in proximity to the filtering device; and
    apply filtering to reduce noise included in the input value to obtain an output value, wherein
    when a difference between a current input value acquired in the acquiring and a past output value obtained in the applying exceeds a first threshold, the filtering includes obtaining a new output value by weighting the current input value with a weight different from a weight for obtaining the past output value, and
    further causing the computer to determine the displacement of the workpiece based on the new output value, and
    the filtering calculates the output value by a moving average, and when the difference exceeds the first threshold, increases the weight of the current input value by decreasing a count of the input values that are subjected to the moving average, and then calculates the new output value, and
    the weiht of the current input value equals an inverse of the count of the input values that are subjected to the moving average.

* * * * *